(12) United States Patent
Künne et al.

(10) Patent No.: US 11,687,473 B2
(45) Date of Patent: Jun. 27, 2023

(54) COMPONENT FOR INITIALIZING A QUANTUM DOT

(71) Applicants: Rheinisch-Westfälische Technische Hochschule (RWTH) Aachen, Aachen (DE); Forschungszentrum Jülich GmbH, Jülich (DE)

(72) Inventors: Matthias Künne, Aachen (DE); Hendrik Bluhm, Aachen (DE); Lars Schreiber, Aachen (DE)

(73) Assignees: Rheinisch-Westfälische Technische Hochschule (RWTH) Aachen, Aachen (DE); Forschungszentrum Jülich GmbH, Jülich (DE)

( * ) Notice: Subject to any disclaimer, the term of this patent is extended or adjusted under 35 U.S.C. 154(b) by 0 days.

(21) Appl. No.: 17/642,527

(22) PCT Filed: Sep. 21, 2020

(86) PCT No.: PCT/DE2020/100811
§ 371 (c)(1),
(2) Date: Mar. 11, 2022

(87) PCT Pub. No.: WO2021/052538
PCT Pub. Date: Mar. 25, 2021

(65) Prior Publication Data
US 2023/0006669 A1    Jan. 5, 2023

(30) Foreign Application Priority Data

Sep. 20, 2019  (DE) .................... 10 2019 125 351.9
Jun. 10, 2020  (DE) .................... 10 2020 115 493.3

(51) Int. Cl.
*H03K 17/92*    (2006.01)
*G06F 13/20*    (2006.01)
(Continued)

(52) U.S. Cl.
CPC ............ *G06F 13/20* (2013.01); *G06N 10/40* (2022.01); *H01L 29/423* (2013.01);
(Continued)

(58) Field of Classification Search
CPC ..................................................... H03K 17/92
(Continued)

(56) References Cited

U.S. PATENT DOCUMENTS

| 8,164,082 B2 * | 4/2012 | Friesen | .................. G06N 10/00 257/E29.071 |
| 2008/0185576 A1 | 8/2008 | Hollenberg et al. | |

(Continued)

FOREIGN PATENT DOCUMENTS

| AU | 2007200501 A1 | 8/2008 |
| DE | 102019202661 A1 | 8/2020 |

(Continued)

OTHER PUBLICATIONS

G.J. Schinner et al., "Confinement and Interaction of Single Indirect Excitons in a Voltage-Controlled Trap Formed Inside Double InGaAs Quantum Wells", New Journal of Physics, vol. 110, issue. 12, pp. 127403-127408, Mar. 19, 2013.
(Continued)

*Primary Examiner* — Tomi Skibinski
(74) *Attorney, Agent, or Firm* — Smartpat PLC (57) ABSTRACT

An electronic component (10) is formed by a semiconductor component or a semiconductor-like structure having gate electrode assemblies (16, 18), for initializing the quantum mechanical state of a qubit.

14 Claims, 5 Drawing Sheets

(51) Int. Cl.
    *G06N 10/40* (2022.01)
    *H01L 29/423* (2006.01)
    *H01L 29/66* (2006.01)
    *H10N 60/10* (2023.01)
    *H10N 69/00* (2023.01)

(52) U.S. Cl.
    CPC .. *H01L 29/42316* (2013.01); *H01L 29/66977* (2013.01); *H03K 17/92* (2013.01); *H10N 60/11* (2023.02); *H10N 60/128* (2023.02); *H10N 69/00* (2023.02); *G06F 2213/40* (2013.01)

(58) Field of Classification Search
    USPC ......................................................... 327/527
    See application file for complete search history.

(56) References Cited

U.S. PATENT DOCUMENTS

| | | |
|---|---|---|
| 2015/0279981 A1 | 10/2015 | Eriksson et al. |
| 2016/0125310 A1 | 5/2016 | Hollenberg et al. |
| 2016/0275410 A1 | 9/2016 | Rogge et al. |
| 2017/0317203 A1 | 11/2017 | Petta et al. |
| 2018/0226451 A1 | 8/2018 | Dzurak et al. |
| 2020/0176569 A1 | 6/2020 | Singh et al. |
| 2020/0312990 A1 | 10/2020 | Roberts et al. |
| 2021/0279134 A1 | 9/2021 | Versluis et al. |

FOREIGN PATENT DOCUMENTS

| | | |
|---|---|---|
| EP | 2075745 A1 | 7/2009 |
| EP | 2560133 A1 | 2/2013 |
| EP | 3016035 A3 | 1/2019 |
| EP | 3016035 B1 | 1/2019 |
| JP | S5994458 U | 6/1984 |
| WO | 2014146162 A1 | 9/2014 |
| WO | 2017020095 A1 | 2/2017 |
| WO | 2017213651 A1 | 12/2017 |
| WO | 2018062991 A1 | 4/2018 |
| WO | 2018236403 A1 | 12/2018 |

OTHER PUBLICATIONS

High, A. A., et al. "Trapping indirect excitons in a GaAs quantum-well structure with a diamond-shaped electrostatic trap." Physical review letters 103.8 (2009): 087403.

Horsman, Clare, et al. "Surface code quantum computing by lattice surgery." New Journal of Physics 14.12 (2012): 123011.

Künne et al., co-pending U.S. Appl. No. 17/642,484, national phase entry of PCT/DE2020/100812.

Künne et al., co-pending U.S. Appl. No. 17/642,677; national phase entry of PCT/DE2020/100809.

Künne et al., co-pending U.S. Appl. No. 17/761,832, national phase entry of PCT/DE2020/100814.

Künne et al., co-pending U.S. Appl. No. 17/636,522; national phase entry of PCT/DE2020/100766.

Künne et al., co-pending U.S. Appl. No. 17/761,885; national phase entry of PCT/DE2020/100810.

Schinner, G. J., et al. "Electrostatically trapping indirect excitons in coupled In x Ga 1-x As quantum wells." Physical Review B 83.16 (2011): 165308.

Veit Langrock, Numerical and theoretical investigation of long-range coherent electron shuttling devices in Silicon/Silicon—Germanium quantum wells for scalable quantum computing, Nov. 30, 2017, retrieved online from https://www.quantuminfo.physik.rwth-aachen.de/global/show_document.asp?id=aaaaaaaaabbnooi.

* cited by examiner

COMPONENT FOR INITIALIZING A QUANTUM DOT

TECHNICAL FIELD

The disclosure relates to an electronic component, which is formed by a semiconductor component or a semiconductor-like structure having gate electrode assemblies, for initializing the quantum mechanical state of a qubit. The disclosure further relates to a method for such an electronic component.

BACKGROUND

Conventional computers use semiconductor components with integrated circuits. These circuits always work with systems which are based on a logical "0" or "1"—i.e. the switch is "on" or "off". In semiconductor memories, this is realized in that the potential is either above or below a threshold value. These two states form the smallest unit in computers and are referred to as "bits".

These semiconductor components often consist of doped silicon elements in order to realize the circuits. For example, transistor circuits can be arranged in such semiconductor components and linked to form a logic circuit. Through continuously improving chemical and physical manufacturing processes, these semiconductor components can now be produced with increasingly extreme compactness. However, this compactness has reached its physical limits. The density of the circuits as well as the temperature often leads to problems in such semiconductor components. In this manner optimizations in particular can be achieved through several layer models, higher switching speeds, or the selection of the semiconductor material. Nevertheless, the computing power is often insufficient for many applications, e.g. in cryptographic technology or when calculating weather or climate models, due to the enormous amounts of data.

To significantly increase computing power, models for so-called quantum computers have long been known. For a variety of reasons, though, it has not yet been technically possible to implement them. The models of quantum computers are designed to exploit the quantum mechanical states of particles such as electrons. A quantum mechanical system with two states as the smallest unit for storing information is referred to as a "qubit". A qubit is defined, for example, by its quantum mechanical spin state, which can be "up" or "down".

The principle of electron spin qubits is always the same, regardless of the material system selected. A semiconductor heterostructure serves as the substrate in this case. The semiconductor heterostructure comprises a two-dimensional electron gas (2DEG). Semiconductor heterostructures are monocrystalline layers of semiconductors with different compositions grown on top of each other. These layer structures provide numerous technically relevant quantization effects in terms of their electronic and optical properties. For this reason, they are particularly suitable for use in the production of microelectronic components. The most important combination of materials at the present time for the production of semiconductor heterostructures is the GaAs/AlGaAs system.

Semiconductor heterostructures form so-called quantum films at the interfaces between different materials. These arise in particular because of the different energy levels in the two materials. The defined energy distribution resulting therefrom causes charge carriers from the surrounding area to collect in the quantum film. Their freedom of movement is largely restricted to the layer in the film, and they form the two-dimensional electron gas (2DEG).

A nanoscopic material structure is referred to as a quantum dot. Semiconductor materials are particularly suitable for this. The mobility of the charge carriers, both electrons and holes, is so restricted in a quantum dot that their energy can no longer assume continuous values, and can thus only assume discrete values. Using nanoscale gate electrodes (also referred to as gates), which are applied to the surface of the component, the potential landscape within the two-dimensional electron gas (2DEG) is shaped in such a manner that individual electrons can be captured in the quantum dots. The spins of these electrons then serve as the basis for the formation of a logical qubit.

Electronic states can be split with regard to their spin state by means of an external magnetic field (Zeeman effect) and thus addressed separately. The spins of these electrons then serve as the basis of eigenstates for the purpose of forming a logical qubit. Furthermore, superimposed states of these two eigenstates can also be realized due to quantum mechanical effects.

US 2017/0317203 A1 discloses a quantum dot device comprising at least three conductive layers and at least two insulating layers. The three conductive layers are electrically insulated from one another. It is described there that one conductive layer is composed of a different material than the other two conductive layers. The conductive layers can include or be composed entirely of aluminum, gold, copper, or polysilicon, for example. The insulating layers, on the other hand, are composed of silicon oxide, silicon nitride, and/or aluminum oxide, for example. The connections between the conductive layers and the insulating layers can cause, inter alia, individual electrons to be shuttled through quantum dots of the device using voltage pulses.

In this quantum dot device, an electron is confined in a potential well. Through quantum mechanical tunneling, an electron is moved from quantum dot to quantum dot. This can lead to inaccuracies or falsifications of the information regarding the quantum mechanical state when an electron moves over longer distances.

WO 2017/020095 A1 discloses a scalable architecture for a processing device for performing quantum processing. The architecture is based on full-silicon CMOS fabrication technology. Transistor-based control circuits are used together with floating gates to operate a two-dimensional array of qubits. The qubits are defined by the spin states of a single electron, which is trapped in a quantum dot. A higher level is described here, meaning how individual qubits can be electrically driven, for example via transistors, etc., including qubit operation and readout. Although reference is made to a "scalable architecture", the array shown does not allow any real scaling, meaning inter alia integration of cryogenic electronics, since no space can be created between the qubits.

U.S. Pat. No. 8,164,082 B2 describes a spin bus quantum computer architecture comprising a spin bus comprising of a plurality of strongly coupled and always on qubits defining a string of spin qubits. A plurality of information-bearing qubits are arranged adjacent to a qubit of the spin bus. Electrodes are formed to the information-bearing qubits and the spin bus qubits to allow control of the establishment and breaking of coupling between qubits in order to allow control of the establishment and breaking of coupling between each information-bearing qubit and the spin bus qubit adjacent to it. The spin bus architecture allows rapid and reliable long-range coupling of qubits.

EP 3 016 035 B1 describes a processing apparatus and methods to operate the same, and particularly, but not exclusively, the invention relates to a quantum processing apparatus which is controllable to perform adiabatic quantum computations.

A quantum processor has the following features: a plurality of qubit elements and a control structure comprising a plurality of control members, wherein each control member is arranged such that it can control a plurality of qubit elements. The control structure is controllable to perform quantum computation using the qubit elements, wherein a quantum state of the qubit elements is encoded in the nuclear or electron spin of one or more donor atoms. The donor atoms are arranged in a plane embedded in a semiconducting structure. A first set of donor atoms is arranged to encode quantum information related to the quantum computation.

A second set of donor atoms is arranged to facilitate electromagnetic coupling between one or more of the first set of donor atoms. The donor atoms of the first set are arranged in a two-dimensional matrix arrangement. The plurality of control members comprises a first set of elongated control members arranged in a first plane above the plane comprising the donor atoms. A second set of elongated control members are provided which are arranged in a second plane below the plane comprising the donor atoms.

To implement a universal quantum computer, it must be possible to couple the qubits over distances of at least a few micrometers, in particular to create space for local control electronics. Structures and structural elements must be provided which allow a quantum dot to be transported to different targets in order to be able to construct logic circuits. There are already approaches in the state of the art in which one or two-dimensional arrays were built from separate quantum dots, through which electrons can then be transported. Due to the very large number of gate electrodes required and corresponding voltages to be set, coupling over several micrometers is impossible to implement or can only be implemented with significant effort using this approach.

While operations on individual qubits can already be checked and evaluated to a satisfactory extent, the ability to connect qubits to form logic circuits is possibly the main problem still to be solved in order to realize a universal quantum computer. Definable quantum mechanical states must be present in order to realize such logic circuits.

SUMMARY

An object of the disclosure is to eliminate the disadvantages of the prior art and to provide an electronic component which allows logic circuits to be realized with quantum dots, whereby the quantum mechanical state is intended to be produced to initialize, for example, a qubit.

The object is achieved by the electronic component for initializing the quantum mechanical state of a qubit of the type mentioned at the outset, comprising
  a) a substrate with a two-dimensional electron gas or electron hole gas;
  b) electrical contacts for connecting the gate electrode assemblies to voltage sources;
  c) a gate electrode assembly having gate electrodes, which is arranged on a surface of the electronic component, for producing a potential well in the substrate;
  d) a reservoir, which is provided as a donor of charge carriers;
  e) the gate electrodes of the gate electrode assemblies having parallel electrode fingers, whereby
    i. the gate electrodes of a first gate electrode assembly in the substrate form a static potential well in which quantum dots are introduced from the reservoir;
    ii. the gate electrodes of a second gate electrode assembly form a movable potential well in the substrate, wherein a charge carrier with its quantum mechanical state can be transported with this potential well;
  f) means for transferring two quantum dots from the reservoir into the static potential well;
  g) a stimulator for orienting or splitting the quantum dots;
  h) means for transferring a charge carrier from the static potential well into the movable potential well.

The object is further achieved by a method for such an electronic component having the following method steps:
  a) introduction of two charge carriers from the reservoir into the static potential well;
  b) bring the movable potential well towards the static potential well;
  c) exchange between the static potential well and the movable potential well so that a charge carrier is located in the movable potential well;
  d) defined orientation of the quantum dots in the static potential well and the movable potential well by means of the stimulator;
  e) moving the movable potential well away.

The disclosure is based in principle on the physical Pauli Exclusion Principle, which states that an electron level can never be occupied by electrons with the same spin. By means of the gate electrodes, a static potential well is now generated on the one hand and, on the other hand, a movable potential well. A pair of charge carriers from the reservoir and with the same energy level is introduced into the static potential well. The pair of charge carriers is subsequently split. The one quantum dot is transferred into the movable potential well. The quantum mechanical state of the quantum dots is oriented in a defined manner by the stimulator to the level, which in the case of an electron is the spin. The quantum dot having the known quantum mechanical state in the movable potential well can now be transported away, for example as an initialized qubit, with the movable potential well.

In order to guide the quantum dot with the movable potential well to the static potential well, the quantum dot must be transported through the substrate over a longer distance without changing the quantum mechanical state. For this purpose, the quantum dot is confined in the potential well, which is generated in a suitable manner by the gate electrode assembly. The potential well then moves continuously and in a directed manner through the substrate and carries the quantum dot with its quantum mechanical state over the distance. To enable continuous movement of the potential well, the electrode fingers of the gate electrodes are connected accordingly.

In an advantageous embodiment of the electronic component, the stimulator is designed as a magnet, which generates a gradient magnetic field for initializing the quantum dots in the static potential well. The quantum dots of an energy level are oriented in a defined manner depending on the orientation of the magnetic field. In the often small structures of this component, micro-magnets, which can be integrated easily into the semiconductor component, can preferably be used. The gradient magnetic field therefore serves to initialize the quantum dots in the static potential well. An oscillating magnetic field can also be used as a gradient magnetic field. These gradient magnetic fields place the quantum dot in a desired quantum mechanical state. The electronic component can thus be initialized so that it is then able to interact with the quantum dot introduced into the same level.

In a further advantageous embodiment of the electronic component, the gate electrodes of the first gate electrode assembly form a static double potential well, wherein means for transporting a quantum dot from the one static potential well into the next static potential well of the static double potential well are provided. Each of the static potential wells thus has a quantum dot with different quantum mechanical states of the same level. The defined orientation of the states is in turn determined by the stimulator. In this case, each of the potential wells is occupied by known quantum mechanical states, which in the case of electrons are the spins. One of the quantum dots held in the double potential well exchanges with the quantum dot of the moved potential well. As a result, the moved quantum dot obtains a defined quantum mechanical state.

In a corresponding advantageous embodiment of the method for such an electronic component, the static potential well is formed as a double potential well in a further step. Each of the two static potential wells of the double potential well is then occupied by charge carriers having different, known quantum mechanical states. The movable potential well is now moved towards the static double potential well. A charge carrier is exchanged between a static potential well and the movable potential well. The movable potential well with the quantum dot can then be guided away. The movable potential well therefore contains a quantum dot whose quantum mechanical state is known and which can then be used to initialize a qubit, for example.

In a preferred embodiment of the electronic component, a gate electrode assembly comprises two parallel gate electrodes, which form a channel-like structure. This measure serves to ensure that the potential well can only move along a certain path in the substrate.

In an advantageous embodiment of such an electronic component, the substrate comprises gallium arsenide (GaAs) and/or silicon germanium (SiGe). These materials are able to form a two-dimensional electron gas in which quantum dots can be generated, held, and moved. In the case of gallium arsenide, the quantum dots are occupied by electrons. In the case of silicon germanium, the quantum dots are occupied by holes that are missing an electron.

In a further preferred embodiment of the electronic component, the respectively interconnected gate electrodes for the moved potential well are configured such that a periodic and/or phase-shifted voltage can be applied to them. This measure enables the potential well to be guided continuously through the substrate. A quantum dot located in the potential well can thus be transported through the substrate with the potential well while retaining its original quantum mechanical state.

In a preferred embodiment of the electronic component, at least every third electrode finger of a gate electrode for the movable potential well is connected together. This is intended to ensure that the potential well is always guaranteed over at least one period through which the potential well is moved. Only in this way is it possible to ensure continuous movement of the potential well with the quantum dot. In principle, other combinations are also possible when interconnecting gate electrodes, as long as the potential well can be moved together with the quantum dot. Correspondingly, an advantageous embodiment of the method for an electronic component is obtained in that at least every third gate electrode is connected together and a voltage is applied periodically to the interconnected gate electrodes.

In a further advantageous embodiment of the electronic component, means of connection are provided for connecting to a qubit of a quantum computer. Transporting the states of quantum dots over greater distances is particularly suitable for quantum computers. In quantum computers, it is necessary to connect qubits to one another. For this reason, the electronic component must provide contacts to connect at least two qubits to one another in order to transfer the quantum states of the quantum dots from one qubit to another qubit.

Further embodiments and advantages will become apparent from the subject matter of the subclaims and the drawings with the accompanying descriptions. Exemplary embodiments are explained in more detail below with reference to the accompanying drawings. The invention should not be limited solely to the exemplary embodiments listed. The present invention is intended to refer to all objects that a person skilled in the art would deem obvious now and in the future to realize the invention. The following detailed description refers to the best embodiments currently possible of the disclosure. They are only intended to illustrate the invention in more detail. The description is therefore not to be understood in a limiting sense, but is merely intended to illustrate the general principles of the invention since the scope of the invention is defined by the appended claims. The prior art cited is considered part of the disclosure.

DETAILED DESCRIPTION

Figure 1:
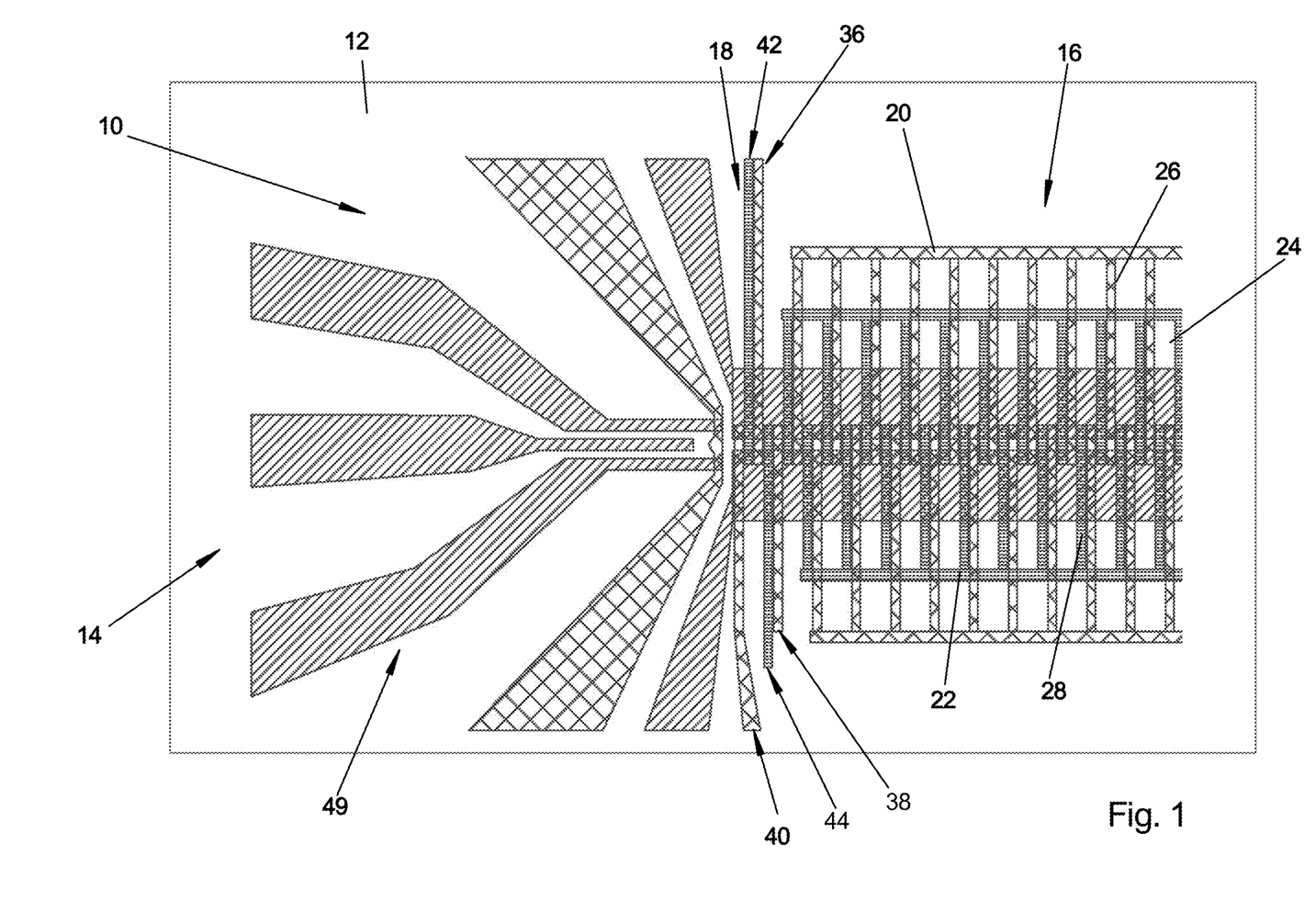
FIG. 1 shows a schematic top view of the electronic component for initializing the quantum state of a quantum dot with a static double potential well.

FIG. 1 shows a first exemplary embodiment of an electronic component 10, which is again formed from a semiconductor heterostructure. The structures of the component are preferably nanoscale structures. Undoped silicon germanium (SiGe) is used as the substrate 12 for the electronic component 10. The electronic component 10 is designed in such a manner that it comprises a two-dimensional electron gas (2DEG). Gate electrode assemblies 16, 18 are provided on the surface 14 of the substrate 12.

The gate electrode assembly 16 has two gate electrodes 20, 22. The individual gate electrodes 20, 22 are electrically isolated from one another in a suitable manner with insulating layers 24. The gate electrodes 20, 22 of the gate electrode assembly 16 are provided for this purpose in layers, wherein the insulating layer 24 is provided between each gate electrode 20, 22 of the gate electrode assembly 16. The gate electrodes 20, 22 further comprise the electrode fingers 26, 28, which are arranged parallel to another on the surface 14 of the substrate 12.

The gate electrode assemblies 16, 18 are supplied with a suitable voltage via electrical connections. By suitably applying sinusoidal voltages to the gate electrodes 20, 22 of the gate electrode assembly 16, a movable potential well is generated in the substrate 12. A quantum dot 42 or charge carrier trapped in this potential well can thus be transported through the substrate in this manner. The potential well is transported longitudinally through the substrate 12 through suitable control of the electrode fingers 26, 28 of the gate electrodes 20, 22 with sinusoidal voltages. The quantum dot 42 confined in such a potential well can be transported with this potential well over a greater distance in the two-dimensional electron gas of the substrate 12 made of SiGe without experiencing a quantum mechanical change of state.

The gate electrode assembly 18 forms a static double potential well. The gate electrode assembly 18 comprises for this purpose barrier gate electrodes 36, 38, 40 and, in addition to the pump gate electrode 42, another pump gate electrode 44, which can set a quantum dot or a charge carrier in motion or in oscillation. The pump gate electrodes 42, 44 are alternately arranged between the barrier gate electrodes 36, 38, and 40. Each of the gate electrodes 36, 38, 40, 42, 44 has electrode fingers 37, 39, 41, 43, 45.

The barrier gate electrode assembly 18 is adjacent to the reservoir 49 for effecting changes in charge.

Figure 2:
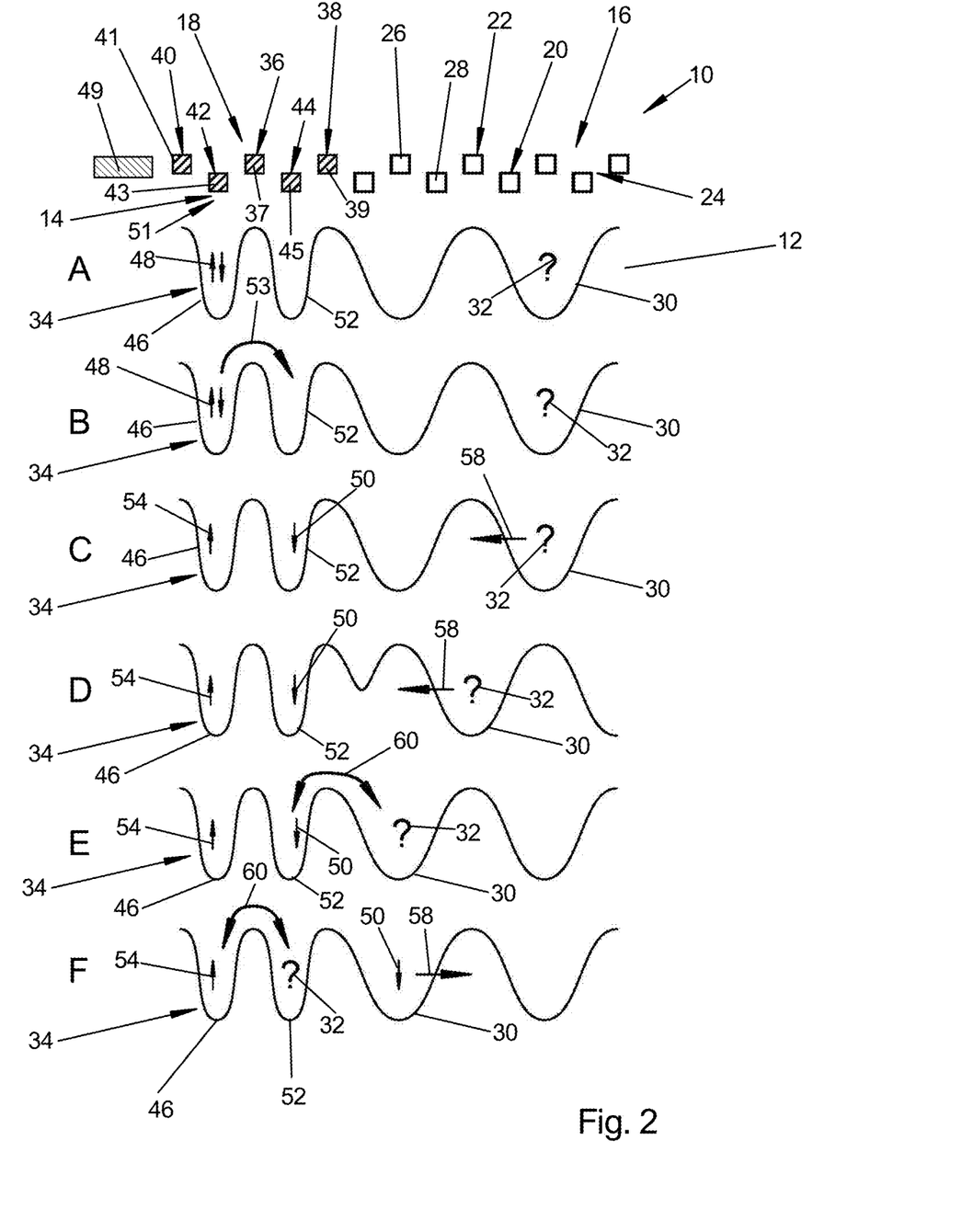
FIG. 2 shows a section of a schematic diagram of an exemplary embodiment of an electronic component with a double potential well for initializing and reading out a qubit.

FIG. 2 shows a section of the first exemplary embodiment of the electronic component 10, which is formed from a semiconductor heterostructure. The structures of the component are preferably nanoscale structures. Undoped silicon germanium (SiGe) is used as the substrate 12 for the electronic component 10. The electronic component 10 is designed in such a manner that it comprises a two-dimensional electron gas (2DEG). Gate electrode assemblies 16, 18 are provided on a surface 14 of the substrate 12.

The gate electrode assembly 16 has two gate electrodes 20, 22. The individual gate electrodes 20, 22 are electrically isolated from one another in a suitable manner with insulating layers 24. The gate electrode assemblies 16, 18 are provided in layers, wherein the insulating layer 24 is provided between each gate electrode 20, 22. The gate electrodes 20, 22 further comprise electrode fingers 26, 28, which are arranged parallel to another on the surface 14 of the substrate 12.

The gate electrode assemblies 16, 18 are supplied with a suitable voltage via electrical connections. By suitably applying sinusoidal voltages to the gate electrodes 20, 22 of the gate electrode assembly 16, a potential well 30 is generated in the substrate 12. A quantum dot 32 or charge carrier trapped in this potential well 30 can thus be transported through the substrate in this manner. The potential well 30 is transported longitudinally through the substrate through suitable control of the electrode fingers 26, 28 with sinusoidal voltages. The quantum dot 32 or charge carrier confined in such a potential well 30 can be transported with this potential well 30 over a greater distance in the two-dimensional electron gas of the substrate 12 made of SiGe without experiencing a quantum mechanical change of state.

The gate electrode assembly 18, on the other hand, forms a static double potential well 34. The gate electrode assembly 18 comprises for this purpose barrier gate electrodes 36, 38, 40 and two pump gate electrodes 42, 44, which can set a quantum dot 32, 50, 54 or a charge carrier in motion or in oscillation. The pump gate electrodes 42, 44 are alternately arranged between the barrier gate electrodes 36, 38, 40. The gate electrodes 36, 38, 40, 42, 44 of the gate electrode assembly 18 are also separated from one another by an insulating layer 24. Each of the gate electrodes 36, 38, 40, 42, 44 has electrode fingers 37, 39, 41, 43, 45. The electrode fingers 37, 39, 41, 43, 45 can be seen in this sectional drawing.

In this figure, the sequences in the substrate 12 of the electronic component 10 for initializing a quantum state of a qubit in a quantum dot are shown schematically below the gate electrode assemblies 16, 18. Sequences from A to F of the positions of the potential wells 30, 34 in the substrate 12 are shown below this to explain the function. The electrode fingers 26, 28 of the gate electrode assemblies 16 form the movable potential well 30 through the substrate 12. The movement of the potential well 30 is effected by appropriately interconnecting the electrode fingers 26, 28. The electrode fingers 26, 28 of the gate electrode assembly 16 provided for this purpose are periodically and alternately interconnected, which effects an almost continuous movement of the potential well 30 through the substrate 12.

The electronic component 10 is based on the physical Pauli Exclusion Principle, which states that an electron level can never be occupied by electrons with the same spin. By means of the gate electrodes 36, 38, 40 and 42, 44, a static double potential well 34 is generated on the one hand, and on the other hand, the movable potential well 30 is generated with the gate electrodes 20, 22. Two charge carriers 48 from a reservoir 49 are introduced into a first potential well 46 of the static double potential well 34. The charge carriers 48 are split and oriented with a stimulator 51, for example with the aid of a gradient magnetic field and the pump gate electrodes 42, 44. A split charge carrier 50 tunnels into a second static potential well 52 of the double potential well 34, which is indicated by the arrow 53. Only one charge carrier 54 remains in the first static potential well. The quantum states of the quantum dots 50, 54 in the potential wells 46, 48 are known due to the orientation of an applied gradient magnetic field.

A further quantum dot 32 is introduced into the second static potential well 52 of the double potential well 34 of the same level by means of the movable potential well 30. The quantum mechanical state of the quantum dot 32 is not known. Arrow 58 indicates the direction of transport of the quantum dot 32 with movable potential well 30. The quantum dot 50 of the second static potential well 52 exchanges with the quantum dot 32 of the movable potential well 30. The quantum mechanical state of the quantum dot 50 is known, and it is now located in the movable potential well 30 and initializes, for example, a qubit.

The quantum dot 32, provided it has the same spin as the quantum dot 50 guided away for the purpose of initialization, tunnels again into the first static potential well 46 of the double potential well 34. A sensor element, which is not shown here, would therefore not detect a change in charge. If the quantum mechanical states of the quantum dots 50 and 32 differ, then a change in charge can be detected. The exchange is symbolized by arrow 60.

Figure 3:
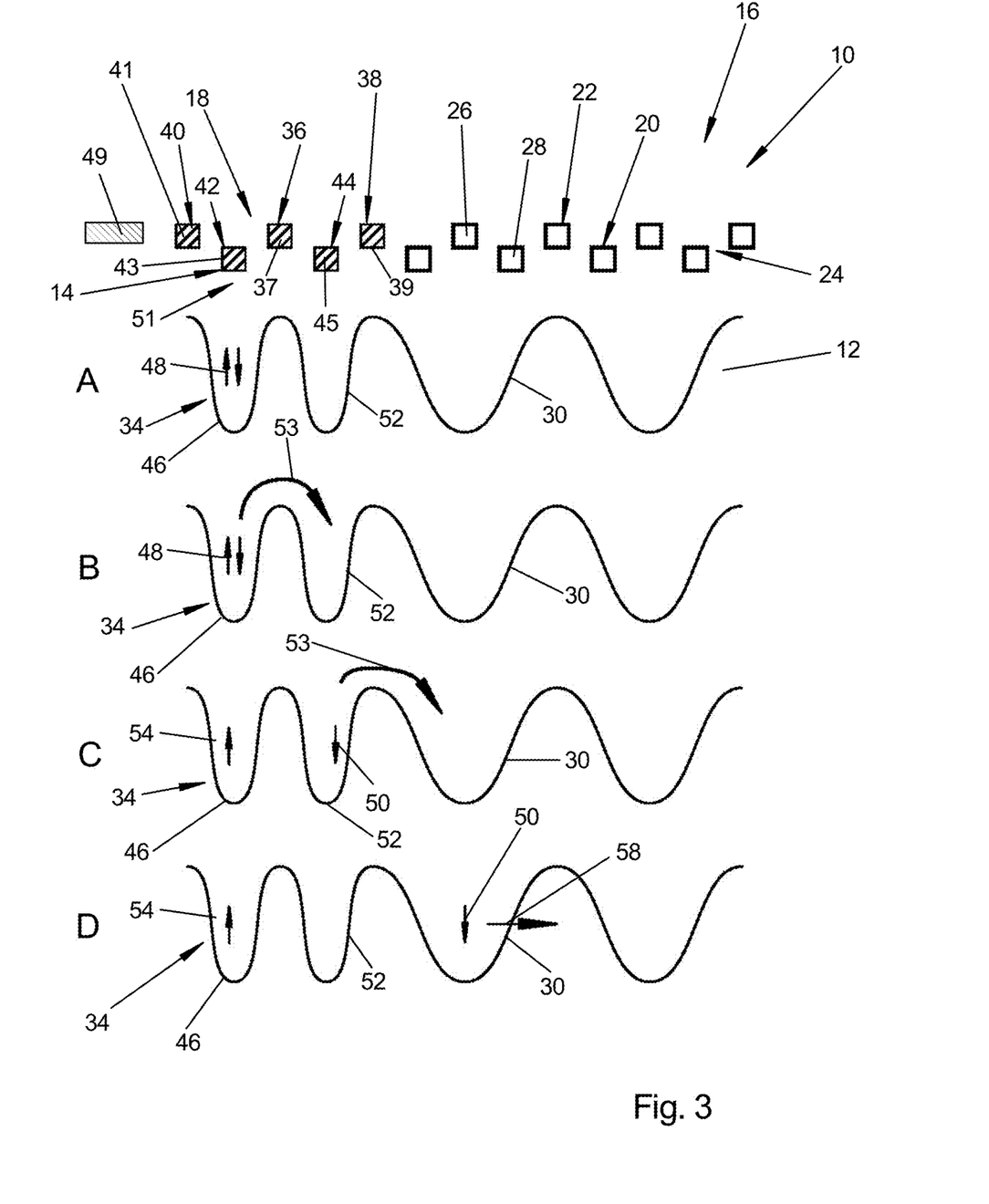
FIG. 3 shows a section of a schematic diagram of an exemplary embodiment of an electronic component with a double potential well for initializing a qubit.

FIG. 3 shows a section of a further exemplary embodiment of the electronic component 10, which is formed from a semiconductor heterostructure. The structures of the component 10 are preferably nanoscale structures. Undoped silicon germanium (SiGe) is used as the substrate 12 for the electronic component 10. The electronic component 10 is designed in such a manner that it comprises a two-dimensional electron gas (2DEG). The gate electrode assemblies 16, 18 are provided on the surface 14 of the substrate 12.

The gate electrode assembly 16 has the two gate electrodes 20, 22 in this case as well. The individual gate electrodes 20, 22 are electrically isolated from one another in a suitable manner with insulating layers 24. The gate electrode assemblies 16, 18 are provided in layers, wherein the insulating layer 24 is provided between each gate electrode 20, 22. The gate electrodes 20, 22 further comprise electrode fingers 26, 28, which are arranged parallel to another on the surface 14 of the substrate 12.

The gate electrode assemblies 16, 18 are supplied with a suitable voltage via electrical connections. By suitably applying sinusoidal voltages to the gate electrodes 20, 22 of the gate electrode assembly 16, a potential well 30 is generated in the substrate 12. A quantum dot or charge carrier trapped in this potential well 30 can thus be transported through the substrate in this manner. The potential well 30 is transported longitudinally through the substrate through suitable control of the electrode fingers 26, 28 with sinusoidal voltages. The quantum dot or charge carrier confined in such a potential well 30 can be transported with this potential well 30 over a greater distance in the two-dimensional electron gas of the substrate 12 made of SiGe without experiencing a quantum mechanical change of state.

The gate electrode assembly 18, on the other hand, forms a static double potential well 34. The gate electrode assembly 18 comprises for this purpose the barrier gate electrodes 36, 38, 40 and two pump gate electrodes 42, 44, which can set a quantum dot 32, 50, 54 or a charge carrier 48 in motion or in oscillation. The pump gate electrodes 42, 44 are alternately arranged between the barrier gate electrodes 36, 38, 40. The gate electrodes 36, 38, 40, 42, 44 of the gate electrode assembly 18 are also separated from one another by an insulating layer 24. Each of the gate electrodes 36, 38, 40, 42, 44 has electrode fingers 37, 39, 41, 43, 45. The electrode fingers 37, 39, 41, 43, 45 can be seen in this sectional drawing.

In this figure, the sequences in the substrate 12 of the electronic component 10 for initializing a quantum state of a qubit in a quantum dot are shown schematically below the gate electrode assemblies 16, 18. The sequences from A to D of the positions of the potential wells 30, 34 in the substrate 12 are shown below this to explain the function. The electrode fingers 26, 28 of the gate electrode assembly 16 form the movable potential well 30 through the substrate 12. The movement of the potential well 30 is effected by appropriately interconnecting the electrode fingers 26, 28. The electrode fingers 26, 28 of the gate electrode assembly 16 provided for this purpose are periodically and alternately interconnected, which effects an almost continuous movement of the potential well 30 through the substrate 12.

By means of the gate electrodes 36, 38, 40 and 42, 44, a static double potential well 34 is generated on the one hand, and on the other hand, the movable potential well 30 is generated with the gate electrodes 20, 22. Two charge carriers 48 from the reservoir 49 are introduced into the first potential well 46 of the static double potential well 34. The charge carriers 48 are split and oriented with the stimulator 51, for example with the aid of a gradient magnetic field. The split charge carrier 50 tunnels quantum mechanically into the second static potential well 52 of the double potential well 34, which is indicated by the arrow 53. Only the charge carrier 54 remains in the first static potential well 46. The quantum states of the quantum dots 50, 54 in the potential wells 46, 48 are known due to the orientation of an applied gradient magnetic field.

The movable potential well 30 is now moved towards the second static potential well 52 of the double potential well 34.

Via tunneling, arrow 53, the charge carrier 50 moves from the static potential well 52 into the movable potential well 30. The quantum dot 50 can now be guided away with the movable potential well 30, arrow 58. The quantum mechanical state of the quantum dot 50 is known, as a result of which a qubit can be initialized, for example.

Figure 4:
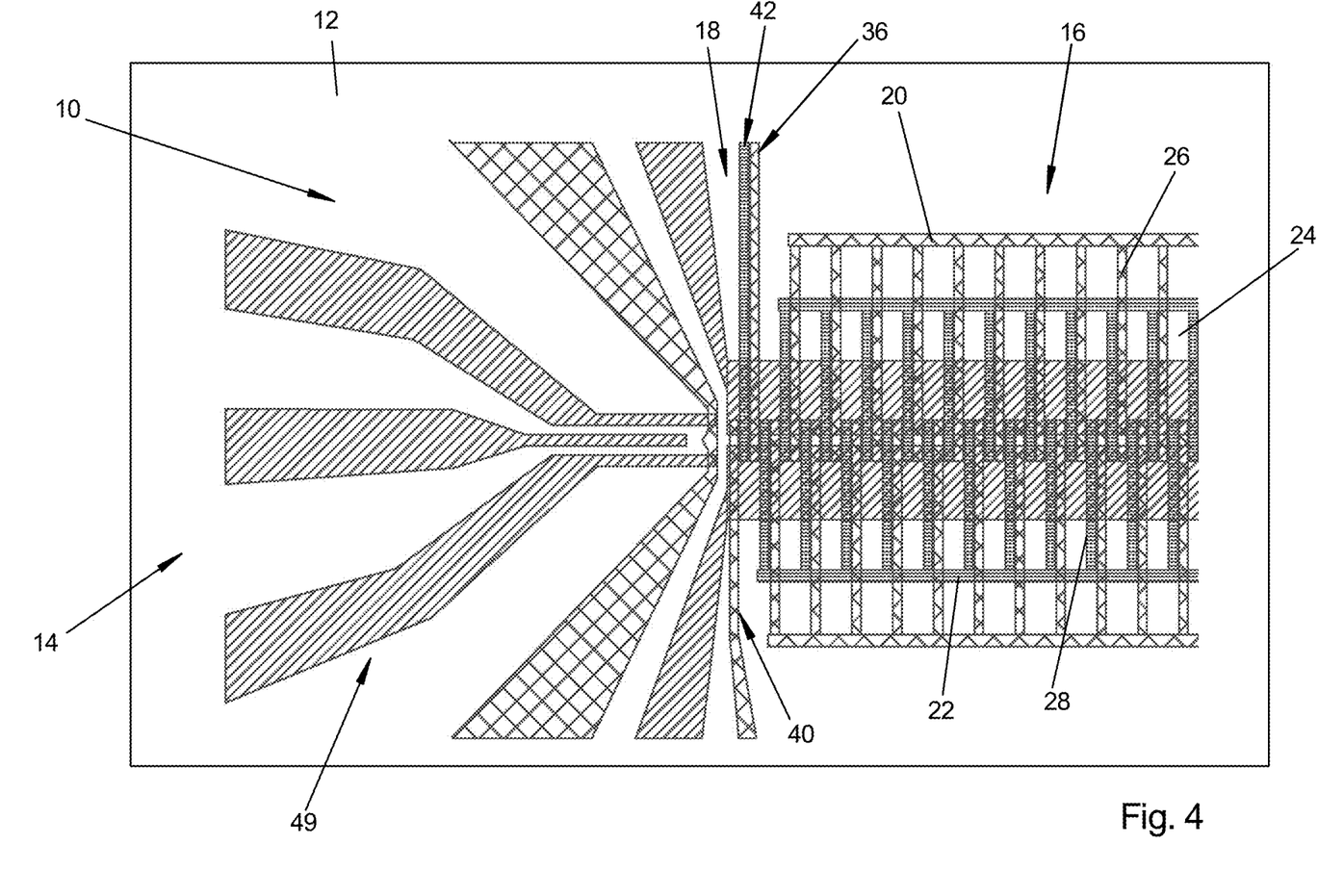
FIG. 4 shows a schematic top view of the electronic component for initializing the quantum state of a quantum dot with a static potential well.

FIG. 4 shows a further exemplary embodiment of an electronic component 10, which is again formed from a semiconductor heterostructure. The structures of the component 10 are preferably nanoscale structures. Undoped silicon germanium (SiGe) is used as the substrate 12 for the electronic component 10. The electronic component 10 is designed in such a manner that it comprises a two-dimensional electron gas (2DEG). The gate electrode assemblies 16, 18 are provided on the surface 14 of the substrate 12.

The gate electrode assembly 16 has two gate electrodes 20, 22. The individual gate electrodes 20, 22 are electrically isolated from one another in a suitable manner with insulating layers 24. The gate electrodes 20, 22 of the gate electrode assembly 16 are provided for this purpose in layers, wherein the insulating layer 24 is provided between each gate electrode 20, 22 of the gate electrode assembly 16. The gate electrodes 20, 22 further comprise the electrode fingers 26, 28, which are arranged parallel to another on the surface 14 of the substrate 12.

The gate electrode assemblies 16, 18 are supplied with a suitable voltage via electrical connections. By suitably applying sinusoidal voltages to the gate electrodes 20, 22 of the gate electrode assembly 16, a movable potential well 30 is generated in the substrate 12. A quantum dot 42 or charge carrier trapped in this potential well 30 can thus be transported through the substrate 12 in this manner. The potential well 30 is transported longitudinally through the substrate 12 through suitable control of the electrode fingers 26, 28 with sinusoidal voltages. The quantum dot 42 confined in such a potential well can be transported with this potential well 30 over a greater distance in the two-dimensional electron gas of the substrate 12 made of SiGe without experiencing a quantum mechanical change of state.

The gate electrode assembly 18 forms a static potential well. The gate electrode assembly 18 comprises for this purpose the barrier gate electrodes 36, 40 and the pump gate electrode 42, which can set a quantum dot or a charge carrier in motion or in oscillation. The pump gate electrode 42 is arranged between the barrier gate electrodes 36 and 40. Each of the gate electrodes 36, 40, 42 has electrode fingers 37, 41, 43.

The barrier gate electrode assembly 18 is adjacent to the reservoir 49 for effecting changes in charge.

Figure 5:
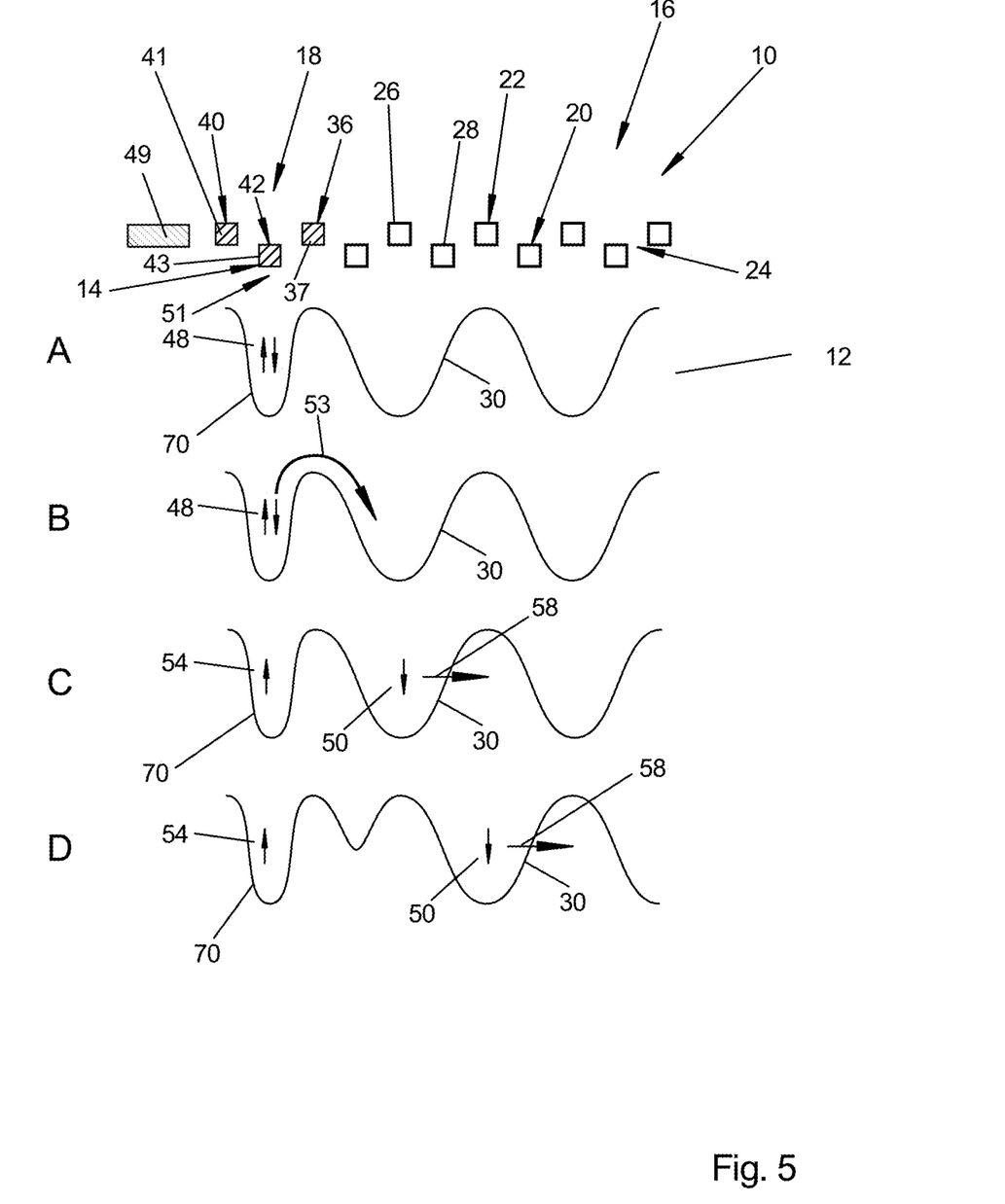
FIG. 5 shows a section of a schematic diagram of an exemplary embodiment of an electronic component with a potential well for initializing a qubit.

FIG. 5 shows a section of a further exemplary embodiment of the electronic component 10, which is formed from a semiconductor heterostructure. The structures of the component 10 are preferably nanoscale structures. Undoped silicon germanium (SiGe) is used as the substrate 12 for the electronic component 10. The electronic component 10 is designed in such a manner that it comprises a two-dimensional electron gas (2DEG). The gate electrode assemblies 16, 18 are provided on the surface 14 of the substrate 12.

The gate electrode assembly 16 has the two gate electrodes 20, 22 in this case as well. The individual gate electrodes 20, 22 are electrically isolated from one another in a suitable manner with insulating layers 24. The gate electrode assemblies 16, 18 are provided in layers, wherein the insulating layer 24 is provided between each gate electrode 20, 22. The gate electrodes 20, 22 further comprise electrode fingers 26, 28, which are arranged parallel to another on the surface 14 of the substrate 12.

The gate electrode assemblies 16, 18 are supplied with a suitable voltage via electrical connections. By suitably applying sinusoidal voltages to the gate electrodes 20, 22 of the gate electrode assembly 16, a potential well 30 is generated in the substrate 12. A quantum dot or charge carrier trapped in this potential well 30 can thus be transported through the substrate in this manner. The potential well 30 is transported longitudinally through the substrate through suitable control of the electrode fingers 26, 28 with sinusoidal voltages. The quantum dot or charge carrier confined in such a potential well 30 can be transported with this potential well 30 over a greater distance in the two-dimensional electron gas of the substrate 12 made of SiGe without experiencing a quantum mechanical change of state.

The gate electrode assembly 18, on the other hand, forms a static potential well 70. The gate electrode assembly 18 comprises for this purpose the barrier gate electrodes 36, 40 and a pump gate electrode 42, which can set a quantum dot 48 or a charge carrier in motion or in oscillation. The pump gate electrode 42 is arranged between the barrier gate electrodes 36, 40. The gate electrodes 36, 40, 42 of the gate electrode assembly 18 are also separated from one another by an insulating layer 24. Each of the gate electrodes 36, 40, 42 has electrode fingers 37, 41, 43. The electrode fingers 37, 41, 43 can be seen in this sectional drawing.

In this figure, the sequences in the substrate 12 of the electronic component 10 for initializing a quantum state of a qubit in a quantum dot are shown schematically below the gate electrode assemblies 16, 18. The sequences from A to D of the positions of the potential wells 30, 70 in the substrate 12 are shown below this to explain the function. The electrode fingers 26, 28 of the gate electrode assembly 16 form the movable potential well 30 through the substrate 12. The movement of the potential well 30 is effected by appropriately interconnecting the electrode fingers 26, 28. The electrode fingers 26, 28 of the gate electrode assembly 16 provided for this purpose are periodically and alternately interconnected, which effects an almost continuous movement of the potential well 42 through the substrate 12.

By means of the gate electrodes 36, 40, and 42, the static potential well 70 is generated on the one hand, and on the other hand, the movable potential well 30 is generated by means of the gate electrodes 20, 22. Two charge carriers 48 from the reservoir 49 are introduced into the potential well 70. The charge carriers 48 are split and oriented with the stimulator 51, for example with the aid of a gradient magnetic field. The split charge carrier 50 tunnels quantum mechanically into the movable potential well 30, which is indicated by the arrow 53. Only the charge carrier 54 remains in the static potential well 70. The quantum states of the quantum dots 50, 54 in the potential wells 70, 30 are known due to the orientation of an applied gradient magnetic field.

The quantum dot 50 can now be guided away with the movable potential well 30, arrow 58. The quantum mechanical state of the quantum dot 50 is known, as a result of which a qubit can be initialized, for example.

LIST OF REFERENCE SIGNS

10 Electronic component
12 Substrate
14 Surface
16 Gate electrode assembly
18 Gate electrode assembly
20 Gate electrode
22 Gate electrode
24 Insulating layers
26 Electrode fingers
28 Electrode fingers
30 Potential well
32 Quantum dot
34 Static double potential well
36 Barrier gate electrode
37 Electrode fingers
38 Barrier gate electrode
39 Electrode fingers
40 Barrier gate electrode
41 Electrode fingers
42 Pump gate electrode
43 Electrode fingers
44 Pump gate electrode
45 Electrode fingers
46 1st static potential well
48 Charge carrier
49 Reservoir
50 Split quantum dot
51 Stimulator
52 2nd static potential well
53 Arrow (tunneling)
54 Remaining quantum dot
58 Arrow (transportation)
60 Arrow (exchange interaction)
70 Static potential well

The invention claimed is:

1. An electronic component (10), which is formed by a semiconductor component or a semiconductor-like structure having gate electrode assemblies (16, 18), for initializing a quantum mechanical state of a qubit, comprising:
   a substrate (12) with a two-dimensional electron gas or electron hole gas;
   electrical contacts for connecting the gate electrode assemblies (16, 18) to voltage sources;
   gate electrode assemblies (16, 18) having gate electrodes (20, 22, 36, 38, 40, 42, 44), which are arranged on a surface (14) of the electronic component (10), for producing potential wells (30, 34) in the substrate (12);
   a reservoir (49), which is provided as a donor of charge carriers (48);
   the gate electrodes (20, 22, 36, 38, 40, 42, 44) of the gate electrode assemblies (16, 18) having parallel electrode fingers (26, 28, 37, 39, 41, 43, 45), wherein
   the gate electrodes (36, 38, 40, 42, 44) of a first gate electrode assembly (18) in the substrate (12) form a static double potential well (34), or the gate electrodes (36, 40, 42) of a first gate electrode assembly (18) in the substrate (12) form a static potential well (70), in which the charge carriers (48) are introduced from the reservoir (49) into quantum dots (50, 54);
   the gate electrodes (20, 22) of a second gate electrode assembly (16) form a movable potential well (30) in the substrate (12), wherein a charge carrier (50) with its quantum mechanical state can be transported with this potential well (30);
   means for transferring two charge carriers (48) from the reservoir (49) into the static potential well (34, 46, 70);
   a stimulator (51) for orienting or splitting the quantum dots (48, 50, 54); and
   means for transferring a charge carrier from the static potential well (34, 52, 70) into the movable potential well (30).

2. The electronic component (10) according to claim 1, wherein the stimulator (51) is designed as a magnet, which generates a gradient magnetic field for initializing the quantum mechanical states in the two quantum dots (32, 50, 54) in the potential well (34, 70).

3. The electronic component (10) according to claim 1,
wherein the gate electrodes (36, 38, 40, 42, 44) of the first gate electrode assembly (18) form a static double potential well (34), and
wherein means for transporting a quantum dot from the one static potential well (46) into the next static potential well (52) of the double potential well (34) are provided.

4. The electronic component (10) according to claim 1,
wherein a gate electrode assembly (16) for the moved potential well (30) comprises two parallel gate electrodes (20, 22), which form a channel-like structure.

5. The electronic component (10) according to claim 1,
wherein the substrate (12) of said electronic component is comprised of gallium arsenide (GaAs) and/or silicon germanium (SiGe).

6. The electronic component (10) according to claim 1,
wherein the respectively interconnected gate electrodes (20, 22) for the moved potential well (30) are configured such that a periodic and/or phase-shifted voltage can be applied to them.

7. The electronic component (10) according to claim 1,
wherein every third electrode finger (26, 28) is connected to a gate electrode (20, 22) for the movable potential well.

8. The electronic component (10) according to claim 1, further comprising a magnetic field generator for a switchable magnetic field.

9. The electronic component (10) according to claim 1, further comprising means of connection for connecting to a qubit of a quantum computer.

10. A method for the electronic component (10) according to claim 1, comprising the following method steps:
   introducing two charge carriers (48) from the reservoir (49) into the static potential well (34, 70);
   bringing the movable potential well (30) towards the static potential well (34, 70);
   exchanging between the static potential well (34) and the movable potential well (30) so that a charge carrier (50) is located in the movable potential well (30);
   defined orienting the quantum dots in the static potential well (34, 70) and the movable potential well (30) by means of the stimulator (51);
   moving the movable potential well (30) away.

11. The method according to claim 10,
wherein the defined orienting of the charge carriers (48) in the quantum dots (50, 54) is achieved by means of a gradient magnetic field of the stimulator (51).

12. The method according to claim 10,
wherein the static potential well (34) is formed as a double potential well, and
wherein each of two static potential wells (46, 52) of the double potential well (34) is occupied by charge carriers (32, 50) having different, known quantum mechanical states, and
wherein the method further comprises:
bringing the movable potential well (30) towards the static potential well (34);
exchanging one quantum dot (50) each between a static potential well (34) and the movable potential well (30); and
moving the movable potential well (30) away with the quantum dot (50).

13. The method according to claim 10,
wherein a phase-shifted voltage is applied to the interconnected gate electrodes (20, 22) for the movable potential well (30), which causes an almost continuous movement of the potential well (30) through the substrate (12), whereby a quantum dot (50) is transported with this potential well (30).

14. A method, comprising:
providing the electronic component (10) according to claim 11,
connecting every fourth gate electrode (20, 22) for the movable potential well (30) to one other, and
applying a periodic voltage to the every fourth gate electrodes (20, 22).

* * * * *